United States Patent
Orlowski et al.

(10) Patent No.: US 7,238,555 B2
(45) Date of Patent: Jul. 3, 2007

(54) SINGLE TRANSISTOR MEMORY CELL WITH REDUCED PROGRAMMING VOLTAGES

(75) Inventors: Marius K. Orlowski, Austin, TX (US); James D. Burnett, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 8 days.

(21) Appl. No.: 11/172,570

(22) Filed: Jun. 30, 2005

(65) Prior Publication Data

US 2007/0001162 A1    Jan. 4, 2007

(51) Int. Cl.
H01L 21/00 (2006.01)
H01L 21/84 (2006.01)

(52) U.S. Cl. .................. 438/151; 438/163; 438/164
(58) Field of Classification Search ................ 438/151, 438/163, 164
See application file for complete search history.

(56) References Cited

U.S. PATENT DOCUMENTS

| | | | |
|---|---|---|---|
| 6,130,461 A * | 10/2000 | Oowaki et al. | 257/369 |
| 6,687,152 B2 | 2/2004 | Ohsawa | |
| 6,861,689 B2 * | 3/2005 | Burnett | 257/296 |
| 7,115,948 B2 * | 10/2006 | Bhattacharyya | 257/347 |
| 2004/0026749 A1 | 2/2004 | Ohsawa | |
| 2004/0124488 A1 | 7/2004 | Fazan et al. | |
| 2004/0142579 A1 * | 7/2004 | Morita et al. | 438/785 |
| 2004/0262667 A1 * | 12/2004 | Bhattacharyya | 257/314 |
| 2006/0125010 A1 * | 6/2006 | Bhattacharyya | 257/347 |

FOREIGN PATENT DOCUMENTS

| | | |
|---|---|---|
| EP | 1355361 A1 | 10/2003 |
| EP | 1357603 A3 | 1/2004 |

OTHER PUBLICATIONS

Fazan et al., A Simple 1-Transistor Capacitor-Less Memory Cell for High Performance Embedded DRAMs, IEEE CICC, 2002, pp. 99-102.
Ohsawa et al., Memory Design Using a One-Transistor Gain Cell on SOI, IEEE SSC, Nov. 2002, pp. 1510-1522, vol. 37, No. 11.
Yoshida et al., A Design of a Capacitorless 1T-DRAM Cell Using Gate-Induced Drain Leakage (GIDL) Current for Low-power and High-speed Embedded Memory, IEEE IEDM, 2003, p. 913.

(Continued)

Primary Examiner—Ngân V. Ngô

(57) ABSTRACT

A transistor fabrication method includes forming an electrode overlying a channel of a semiconductor on insulator (SOI) substrate. Source/drain structures are formed in the substrate on either side of the channel. The source/drain structures include a layer of a second semiconductor over a first semiconductor. The first and second semiconductors have different bandgaps. The second semiconductor extends under the gate electrode. The source/drain structures may be formed by doping the source/drain regions and etching the doped regions selectively to form voids. A film of the second semiconductor is then grown epitaxially to fill the void. A film of the first semiconductor may be grown to line the void before growing the second semiconductor. Alternatively, the second semiconductor is a continuous layer that extends through the channel body. A capping layer of the first semiconductor may lie over the second semiconductor in this embodiment.

12 Claims, 6 Drawing Sheets

OTHER PUBLICATIONS

Kuo et al., A Capacitorless Double-Gate DRAM Cell, IEEE EDL, Jun. 2002, pp. 345-347, vol. 23, No. 6.

Okhonin et al., A Capacitor-Less 1T-DRAM Cell, Feb. 2002, pp. 85-87, vol. 23, No. 2.

Inoh et al., FBC (Floating Body Cell) for Embedded DRAM on SOI, 2003, pp. 63-64, Symposium on VLSI Technology Digest of Technical Papers.

* cited by examiner

SINGLE TRANSISTOR MEMORY CELL WITH REDUCED PROGRAMMING VOLTAGES

RELATED APPLICATION

The subject matter of the following applications, including this application, is related; Orlowski and Burnett, Single Transistor for Memory Cell with Reduced Recombination Rates, patent application Ser. No. 11/172,569, filed Jun. 30, 2005, and Orlowski and Burnett, Single Transistor Memory Cell with Reduced Programming Voltages, U.S. patent application Ser. No. 11/172,570, filed Jun. 30, 2005.

FIELD OF THE INVENTION

The present invention is in the field of semiconductor fabrication processes and, more particularly, fabrication processes for making storage cells.

RELATED ART

Dynamic random access memory (DRAM) is a well-known storage technology in which a single bit of information is represented as charge stored on a capacitive element. Traditional DRAM cells employed a transistor and a small capacitor to store the charge that differentiates a "1" from a "0." With the advent of semiconductor on insulator (SOI) processes, single transistor, "capacitorless" DRAM cells (i.e., one transistor and no distinct capacitor) have been proposed and implemented. In these so called 1-transistor (1T) cells, electron-hole pairs are generated in the body of the transistor by pulsing the gate, drain, and possibly source terminals in a defined sequence. In the case of an NMOS transistor, as an example, it is possible to generate electron-hole pairs in the channel body while biasing the transistor in an "ON" state. In the ON state, the transistor includes a conductive channel adjacent the interface between the gate dielectric and the channel body. Electrons are quickly swept out to the drain. The excess holes, on the other hand, are repelled by the positive voltage on the gate electrode and migrate away from the gate dielectric interface. The net effect of this activity is a transient increase in the number of holes in the channel body. 1T cells take advantage of this activity by intentionally generating excessive holes as a means of writing a "1" to the cell.

Unfortunately, as indicated above, the charge imbalance in the channel body is transient and will dissipate if not "refreshed" periodically. Refreshing a DRAM, whether the cell is a conventional cell or a 1T cell, requires a dedicated operational sequence, during which all cells in the DRAM are refreshed. During a refresh operation, transient currents are increased and the device is generally unavailable for conventional read and write operations. While the reduction in availability or bandwidth can be at least partially compensated by appropriate buffering, the transient currents that occur during refresh result in increased standby current and increased standby power consumption. Thus, the frequency with which a DRAM must be refreshed (referred to as the refresh period) is a measure of the potential performance of the device and the standby power consumption of the device. Longer refresh periods are always preferred to shorter refresh periods. It would be desirable, therefore, to implement a fabrication process and a device structure for increasing the refresh period of a DRAM device and, more particularly, a 1T DRAM device. It would be further desirable if the improvements directed at charge retention in memory cells were also useful for implementing low voltage, low power memory cell programming.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A semiconductor fabrication process and a semiconductor device employ a 1T cell that is characterized by a desirably long refresh period and low voltage programming. The long refresh period is achieved by providing a majority carrier migration barrier. The migration barrier is of a material that creates a potential well for majority carriers. The geometry of the migration barrier is designed to prevent or limit majority carriers in the transistor channel body from migrating to areas having a high density of recombination centers such as at the wafer surface and at the edges of the source/drain regions. By impeding majority carrier migration, the rate of recombination is reduced and thereby increases the retention time of the device. For embodiments in which holes constitute the majority carrier in the channel body, the potential well may be implemented using a narrow band gap semiconductor within the transistor channel. Silicon germanium ($Si_{1-X}Ge_X$) is an example of such a material. When positioned in proximity to p-type silicon, the silicon germanium creates a valence band offset by virtue of which holes in the transistor channel body will be confined and will, therefore, tend to accumulate. By forming the migration barrier as a horizontally oriented layer, the migration barrier impedes the vertical migration of the holes and thereby decreases the amount of recombination.

The properties of semiconductors such as silicon germanium that are beneficial for improving charge retention in memory cells are also useful for implementing low voltage, low power memory cell programming. Specifically, the relatively narrow band gap of silicon germanium enables devices fabricated with silicon germanium source/drain regions to achieve adequate band-to-band tunneling at low voltages.

Figure 1:
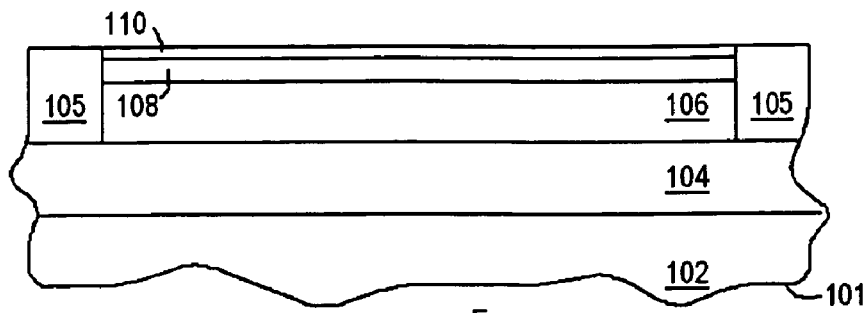
FIG. 1 is a cross sectional view of a semiconductor wafer at an intermediate stage in an integrated circuit fabrication process emphasizing the use of a potential well layer in the starting material as a majority carrier migration barrier according to an embodiment of the invention.

Referring now to the drawings, FIG. 1 is a partial cross-sectional view of a semiconductor wafer 101 at an intermediate stage in the fabrication of a "high retention" integrated circuit 100 according to the present invention. In the depicted embodiment, wafer 101 includes a semiconductor layer 106 of a first semiconductor material overlying a buried dielectric layer 104 overlying a wafer bulk 102. The depicted implementation includes a migration barrier layer 108 of a second semiconductor material overlying a semiconductor layer 106 and a semiconductor capping layer 110 of the first semiconductor material overlying migration barrier layer 108. The upper and lower boundaries of migration barrier layer 108 define a migration barrier. Isolation structures 105 are located at either end of semiconductor layer 106 to provide physical and electrical isolation between adjacent devices. Isolation structures 105 are preferably implemented as conventional silicon oxide, shallow trench isolation (STI) structures. Importantly for 1T memory cells, semiconductor layer 106 is an electrically isolated (floating) structure in which charge can be stored for an appreciable duration (limited primarily by the carrier lifetime).

In one embodiment, semiconductor layer 106 is crystalline silicon, which may be doped with an n-type or p-type impurity. Buried dielectric layer 104 may be suitable implemented with a silicon-oxide compound, in which case buried dielectric layer 104 is also referred to as buried oxide (BOX) layer 104. Bulk 102 of wafer 101 may be crystalline silicon or another semiconductor material exhibiting appropriate electrical and mechanical properties. Semiconductor layer 106, BOX layer 104, and bulk 102 may all be provided in the wafer starting material (i.e., these layers may be formed by a wafer supplier as part of the starting material used by the device manufacturer). In other embodiments, BOX layer 104 and semiconductor layer 106 may be fabricated by the device manufacturer as part of the device fabrication process.

Figure 2:
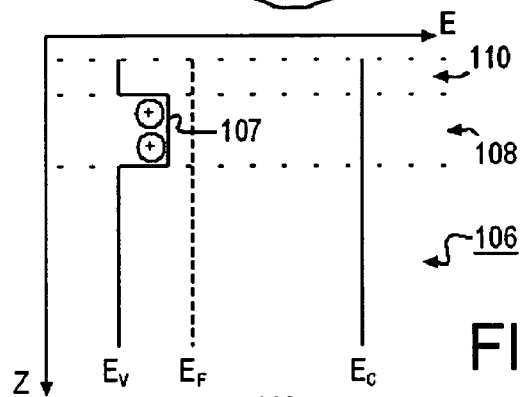
FIG. 2 is a conceptual depiction of the energy bands associated with the wafer of FIG. 1.

Migration barrier layer 108, when located between semiconductor layer 106 and capping layer 110, creates a potential well for majority carriers in wafer 101 that is conceptually depicted in FIG. 2. In the depicted implementation, the band gap of the material used for migration barrier layer 108 is less than the band gap of the semiconductor layer 106 (and semiconductor capping layer 110). In addition, the valence energy band of the material migration barrier material (e.g., $Si_{1-X}Ge_X$) is at a greater potential than the valence energy band of semiconductor layer 106 and semiconductor capping layer 110 (e.g., Si). Because the Fermi level ($E_F$) is constant throughout the conductive wafer substrate and the conduction band edge ($E_C$) varies only slightly due to the migration barrier, the band gap differential at equilibrium (no applied voltage) between semiconductor layer 106 and migration barrier layer 108 produces a valence band offset 107 defined by the boundaries of migration barrier layer 108.

Valence band offset 107 creates a region that retains holes and thereby reduces migration. Because of the geometrical configuration of migration barrier layer 108 (a horizontally oriented layer) the valence band offset 107 impedes hole migration in the vertical direction (the direction perpendicular to an upper surface of wafer 101). Holes generated in semiconductor layer 106 will, therefore, encounter a barrier to migrating to an upper surface of wafer 101. Because recombination centers are prevalent at the wafer upper surface, migration barrier layer 108 effectively reduces the rate of recombination by limiting the number of holes than can reach the most efficient recombination centers.

The formation of migration barrier layer 108 and semiconductor capping layer 110 is an implementation detail. In one embodiment, epitaxial deposition is used to grow a silicon germanium migration barrier layer 108 on semiconductor layer 106 and a silicon semiconductor capping layer 110 on migration barrier layer 108. In a preferred implementation of the epitaxial formation embodiment, the formation of migration barrier layer 108 and semiconductor capping layer 110 is achieved in a single epitaxial process step during which a germanium precursor is present in the epitaxial chamber during formation of migration barrier layer 108.

The implementation described in the preceding paragraphs (where the bandgap of migration barrier layer 108 is less than the bandgap of semiconductor layer 106) is suitable for use with NMOS transistors (where holes are the majority carrier in the transistor channel body). In this implementation, semiconductor layer 106 is lightly doped p-type silicon and migration barrier layer 108 is a narrow bandgap material such as silicon germanium ($Si_{1-x}Ge_x$). For purposes of this disclosure, a narrow bandgap material is a material having a bandgap that is less than the bandgap of silicon (approximately 1.12 eV at 300 K).

$Si_{1-x}Ge_x$ exhibits a bandgap that is intermediate between the bandgap of silicon and the bandgap of germanium (~0.66 eV at 300 K) where the bandgap varies roughly linearly with the percentage of germanium in the alloy (Vegard's law). The germanium content of migration barrier layer 108 is preferably in the range of approximately 15 to 55%. While silicon germanium has been used in MOS transistors to engineer stress differentials to improve carrier mobility, the prevailing implementation of such use is in conjunction with PMOS transistors, where the stress induced by SiGe improves hole mobility. In contrast to those applications, $Si_{1-x}Ge_x$ is used herein to reduce the recombination rate of electron-hole pairs in the channel region and thereby improve the retention time and increase the refresh period for 1T memory cell arrays.

The described implementation uses NMOS transistors on p-type silicon and a narrow band gap material for migration barrier layer 108. The concept of introducing a bandgap differential underlying the transistor channel to impede recombination by restricting vertical (and possibly lateral) migration of excess carriers is extensible, however, to other implementations. For example, an analogous recombination reduction effect may be achieved for PMOS transistor implementations in which semiconductor layer 106 is n-type and the bandgap of migration barrier layer 108 is less than that of layer 106 and the conduction energy band of migration barrier layer 108 is lower than that of semiconductor layer 106 (for example, a silicon carbon (SiC) layer 106 and a silicon layer 108). In either the PMOS or NMOS implementations, the presence of the first and second semiconductor materials in proximity to each other creates an energy band offset wherein the potential energy level of majority carriers in the second semiconductor, which in this example is migration barrier layer 108, is lower than the potential energy level of majority carriers in the first semiconductor (capping layer 110 or semiconductor layer 106. The potential energy level is the energy level of (the valence band for p-type material where holes are the majority carrier and the conduction band for n-type material where electrons are the majority carrier).

Figure 3:
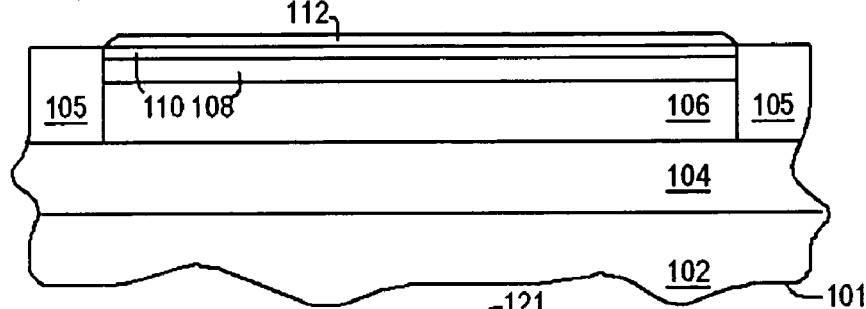
FIG. 3 depicts processing subsequent to FIG. 1 in which a gate dielectric layer is formed over a semiconductor capping layer.

Referring now to FIG. 3, a gate dielectric 112 is formed overlying semiconductor capping layer 110. Embodiments using a silicon semiconductor capping layer 110 may employ a traditional, thermally-formed silicon dioxide gate dielectric layer 112. Alternatively, gate dielectric layer 112 may include a deposited, high-k material (a material having a dielectric constant greater than 4.0) such as any of a variety of metal-oxide and metal-nitrido-oxide compounds.

Figure 4:
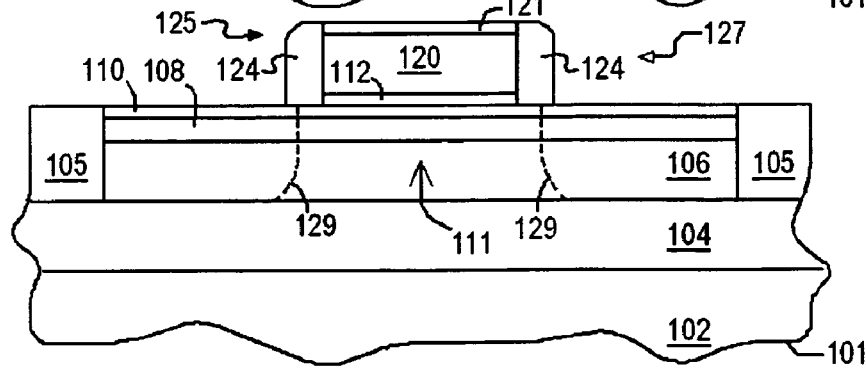
FIG. 4 depicts processing subsequent to FIG. 3 in which a gate module is formed over the gate dielectric layer.

Referring to FIG. 4, a transistor gate module 125 has been formed on gate dielectric 112. In the depicted embodiment, transistor gate module 125 includes an electrically conductive gate electrode 120, a capping layer 121, and spacers 124 formed on sidewalls of gate electrode 120. Gate electrode 120 may be a traditional, doped polycrystalline silicon (polysilicon) gate electrode. Alternatively, gate electrode 120 may include alternative gate materials such as various metal gate materials including tantalum carbide (TaC), tantalum nitride (TaN) or titanium nitride (TiN) that will be familiar to those skilled in the field of semiconductor fabrication. Capping layer 121 and spacers 124 may be silicon nitride, silicon oxide, or another electrically insulating material exhibiting good etch selectivity with respect to the material of gate electrode 120. Formation of spacers 124 is preferably achieved in the conventional manner by depositing a conformal dielectric film overlying gate electrode 120 and wafer 101 and thereafter performing an anisotropic (dry) etch.

In a one-dimensional migration barrier embodiment, a transistor 127 is made by forming source/drain regions 129. Formation of source/drain regions 129 includes conventional ion implantation of an appropriate impurity (e.g., arsenic or phosphorous for NMOS transistors and boron for PMOS transistors) using gate module 125 as an implant mask. In this implementation, source/drain regions 129 are self aligned to gate module 125 and are laterally displaced within semiconductor layer 106 on either side of a channel body 111 of transistor 127. Channel body 111 extends laterally between source/drain regions 129 and vertically from gate dielectric 112 to BOX layer 104. Source/drain regions 129 are indicated with dashed lines in FIG. 4 to convey their formation as optional. In a two-dimensional migration barrier implementation described below with respect to FIG. 5, source/drain formation is postponed.

Transistor 127 as depicted in FIG. 4 is suitable for reducing recombination of holes because the location and orientation of migration barrier layer 108 retards the vertical migration of holes to the substrate surface, where recombination centers are likely to be numerous due to the large number of surface states. Moreover, this migration barrier functionality is achieved with a minimum of additional processing steps. Migration barrier layer 108 as depicted in FIG. 4 may be referred to herein as a one dimensional barrier because it does not restrict lateral migration of holes (migration in a plane parallel to the wafer upper surface). Lateral migration of holes may result in an undesirably high recombination rate if migrating holes reach regions, such as the regions at the boundaries of implanted source/drain regions, where recombination centers are likely to be prevalent.

Figure 5:
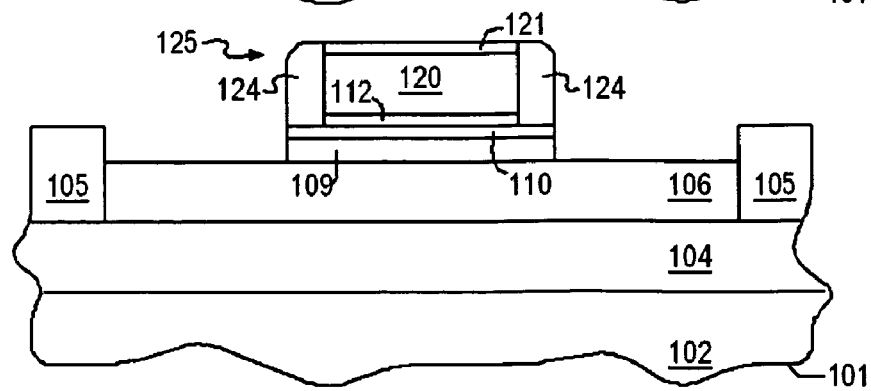
FIG. 5 depicts processing subsequent to FIG. 4 in which the migration barrier is etched using the gate module as a mask.

The embodiment depicted in FIG. 5 addresses the lateral migration issue by patterning migration barrier layer 108 (and capping layer 110) using gate structure 125 as a mask to form a two-dimensional migration barrier 109. Two dimensional migration barrier 109, in addition to limiting the vertical migration of majority carriers in transistor channel body 111, limits the lateral migration of channel body majority carriers to the lateral boundaries of migration barriers 109 (defined by the boundaries of gate structure 125). One can imagine an extension of the potential well diagram of FIG. 2 in which an analogous potential well is present in the lateral direction defined by the lateral boundaries of migration barrier 109. In this implementation, hole migration is restricted in both a vertical and a horizontal direction.

The patterning of migration barrier layer 108 as described in the preceding paragraph thus represents a tradeoff between additional carrier migration reduction and additional processing. While the embodiment depicted in FIG. 5 incurs the additional processing required to pattern migration barrier 109 and to refill the resulting source/drain recesses, other embodiments may elect to bypass the processing of FIG. 5 and use the migration barrier layer 108 of FIG. 4 instead of the potential well structure 109 of FIG. 5 for hole migration prevention. In the embodiment depicted in FIG. 5, formation of migration barrier 109 includes anisotropic etching through semiconductor capping layer 110 and migration barrier layer 108 to expose an upper surface of semiconductor layer 106.

Figure 6:
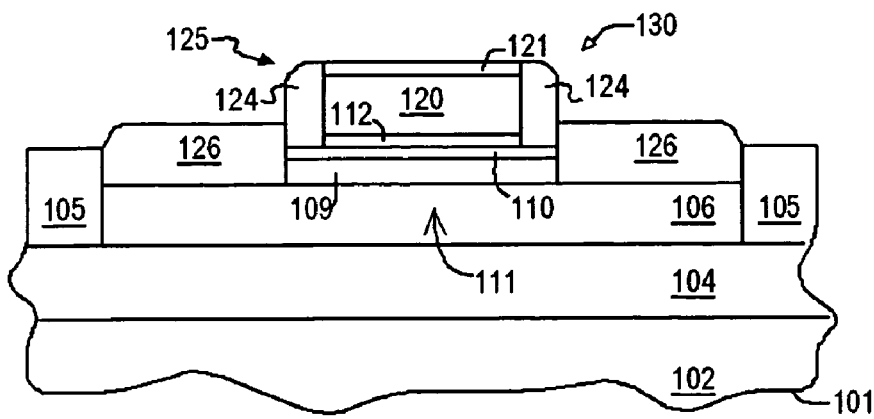
FIG. 6 depicts processing subsequent to FIG. 5 in which source/drain regions are formed on either side of the migration barrier.

Referring now to FIG. 6, source/drain structures 126 are formed overlying the exposed portions of semiconductor layer 106. As suggested by the name, source/drain structures 126 will be used for the source/drain regions of a resulting transistor 130. Forming source/drain structures 126 may include selective epitaxial growth of a silicon layer using semiconductor layer 106 as a seed. In the embodiment depicted in FIG. 6, source/drain structures 126 are elevated source/drain structures having an upper surface above the interface between gate dielectric 112 and the underlying substrate (e.g., semiconductor capping layer 110).

A source/drain implant (not depicted) may follow formation of source/drain structures 126 to complete the formation of a transistor 130 that includes two-dimensional migration barrier 109. In another embodiment, structures 126 may be in-situ doped during the selective eiptaxy process. In one embodiment, transistor 130 is an NMOS transistor in which transistor channel body 111 is a p-type region and source/drain structures 126 are n-type. In this embodiment, the energy band alignment between migration barrier 109 and the adjacent structures (semiconductor layer 106, capping layer 110, and source/drain structures 126) and the geometrical configuration of migration barrier 109 restrict holes generated in channel body portion 111 from migrating vertically to recombination centers at the wafer upper surface and from migrating laterally to recombination centers at the boundaries of source/drain structures 126. By restricting migration to regions where recombination centers are prevalent, transistor 130 exhibits improved carrier lifetime and thereby functions more efficiently as a storage cell.

Figure 7:
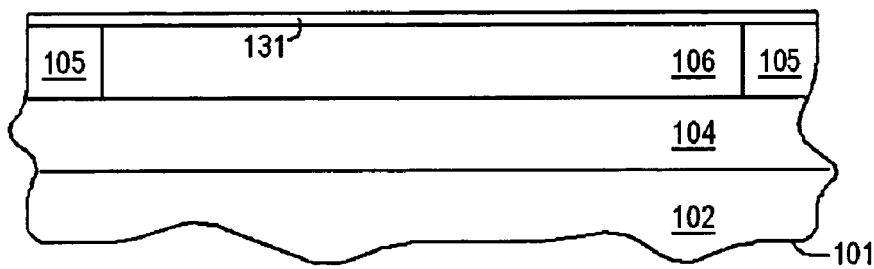
FIG. 7 is a partial cross sectional view of a starting material suitable for an alternative implementation of a reduced carrier recombination process emphasizing a wafer having a silicon germanium layer over a buried oxide layer.
Figure 8:
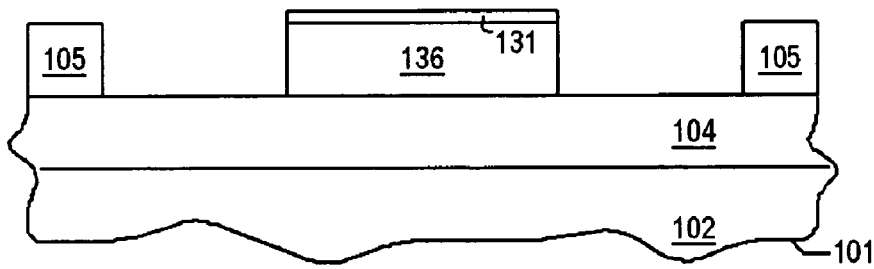
FIG. 8 depicts processing subsequent to FIG. 7 in which the silicon germanium layer is patterned.

Referring now to FIG. 7, an alternative implementation of the invention is depicted in which the starting material for wafer 101 includes a semiconductor layer 106 of a first semiconductor material such as silicon germanium ($Si_{1-X}Ge_X$). A thin dielectric layer 131, which may be silicon oxide, silicon nitride, or the like, is formed over semiconductor layer 106. Dielectric layer 131 and semiconductor layer 106 are then etched or otherwise patterned as shown in FIG. 8 to remove peripheral portions of layer 106 and form semiconductor structure 136. Semiconductor structure 136 is positioned to align with a subsequently formed transistor gate module. In the depicted embodiment, the peripheral portions of semiconductor layer 106 are completely removed so as to expose the underlying BOX layer 104. In another embodiment (not shown in FIG. 8), the etch is stopped before BOX layer 104 is exposed so that a thin layer of semiconductor layer 106 remains in the peripheral portions. This remnant layer may provide a better seed surface for a subsequent selective epitaxy process.

Figure 9:
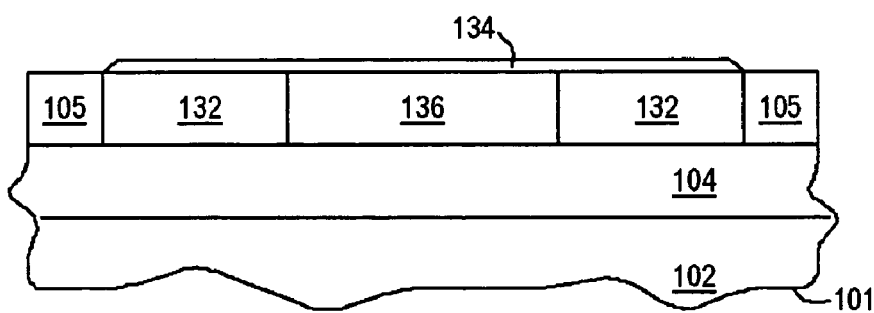
FIG. 9 depicts processing subsequent to FIG. 8 in which silicon structures are formed adjacent the silicon germanium structure and a silicon capping layer is formed over the silicon and silicon germanium.

In FIG. 9, semiconductor structures 132 of a second semiconductor material have been formed adjacent semiconductor structure 136. In one embodiment semiconductor structures 132 are silicon structures formed by selective epitaxial growth, CVD, or a combination thereof. Semiconductor structures 132 may be doped (in situ or implanted) or undoped silicon structures. In an embodiment suitable for use with NMOS transistors, semiconductor structures 132 are preferably doped n-type. In one embodiment, formation of semiconductor structures 132 includes a chemical mechanical polish (CMP) process or other suitable planarization process to produce a planar upper surface between structures 136 and 132. Thereafter, as depicted in FIG. 9, a capping layer 134 may be formed overlying semiconductor structures 132 and 136. Capping layer 134 is preferably comprised of the same semiconductor material as structures 132. In implementations where the semiconductor material of structures 132 is silicon, capping layer 134 is preferably crystalline silicon formed by epitaxial growth. In this embodiment, capping layer 134 not only provides a boundary for a majority carrier potential well (described below), it also facilitates integration with subsequent processing steps, such as the gate dielectric and gate module formation steps, that are typically performed upon silicon.

In contrast to the one-dimensional migration barrier layer 108 (of FIG. 4), the embodiment depicted in FIG. 9 includes a two-dimensional potential well for majority carriers. Whereas the implementation depicted in FIG. 4 constrains majority carrier movement in one dimension (the vertical direction), the implementation depicted in FIG. 9 constrains majority carrier movement in two dimensions or directions. The valence band offset between material 134 and 136 constrains hole movement in the vertical direction (analogous to the valence band offset depicted in FIG. 2). In addition, however, the valence band offset between semiconductor structures 132 (e.g., silicon) and semiconductor structure 136 (e.g., $Si_{1-X}Ge_X$) constrains majority carrier migration in a lateral direction. The lower barrier is formed by the valence band offset between 136 and the dielectric 104.

Figure 10:
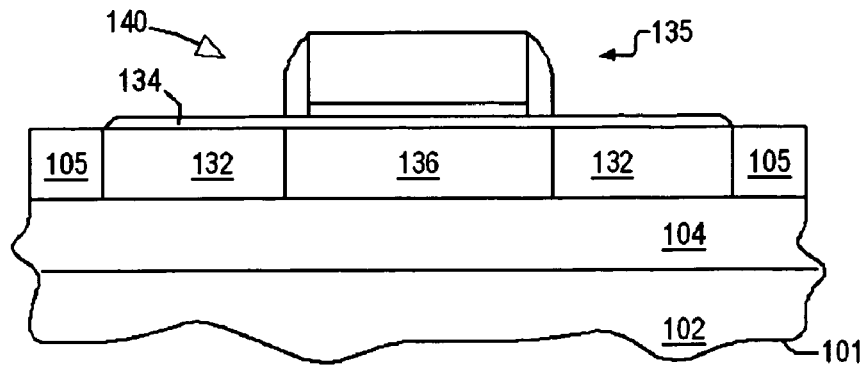
FIG. 10 depicts processing subsequent to FIG. 9 in which a gate module is formed and the transistor is completed.

As depicted in FIG. 10, processing subsequent to that depicted in FIG. 9 includes forming a gate module 135 similar to gate module 125 of FIG. 6 where gate module 135 is laterally aligned with the boundaries of silicon germanium structure 136. After source/drain processing (not depicted), the resulting transistor 140 includes a silicon germanium structure 136 that extends downward vertically all the way to BOX layer 104 and silicon semiconductor structures 132 disposed on either side of silicon germanium structure 136.

Figure 11:
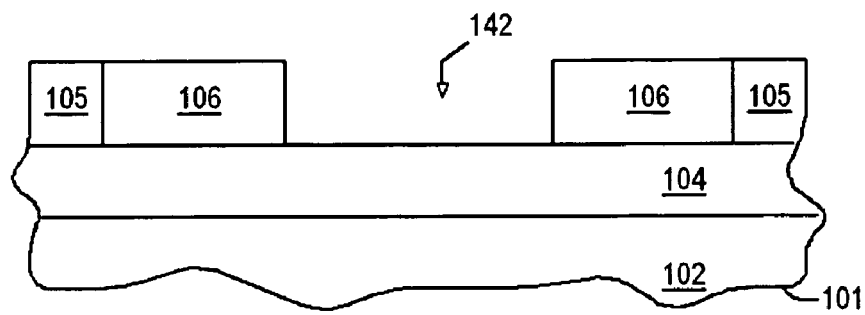
FIG. 11 depicts an alternative to the processing sequence of FIG. 7 through FIG. 10 wherein a void is formed in a silicon layer.

Referring to FIG. 11, another embodiment of a processing sequence suitable for forming a high retention transistor includes forming a void 142 in semiconductor layer 106 of wafer 101. In this embodiment, semiconductor layer 106 is preferably silicon and void 142 is located in a region where a silicon germanium structure will be formed subsequently. The formation of void 142 may include "dummy gate" processing in which the wafer is patterned using a gate mask or the obverse of a gate mask to expose the region of semiconductor structure 106 where a gate module will be formed. Void 142 is then created using conventional silicon etch. In the depicted embodiment, void 142 extends entirely through semiconductor layer 106 to expose the underlying BOX layer 104. In another embodiment (not depicted), void 142 does not extend entirely through semiconductor layer 106, leaving a thin layer of semiconductor layer 106 just sufficient to cover BOX layer 104. This embodiment may be preferred to provide a better seed layer for a subsequent epitaxy refill process.

Figure 12:
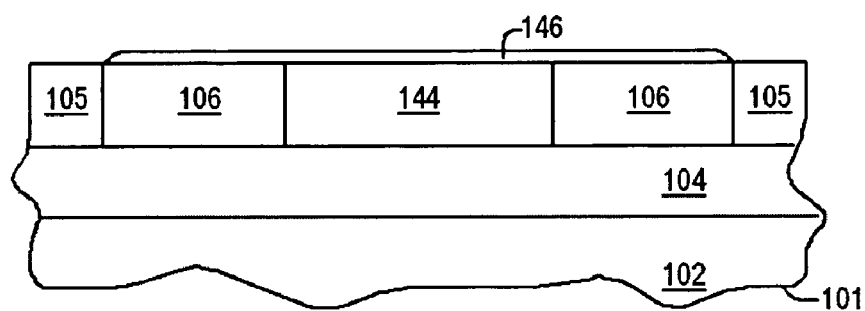
FIG. 12 depicts processing subsequent to FIG. 11 in which the void is filled with silicon germanium and a silicon capping layer is deposited over the silicon and silicon germanium.
Figure 13:
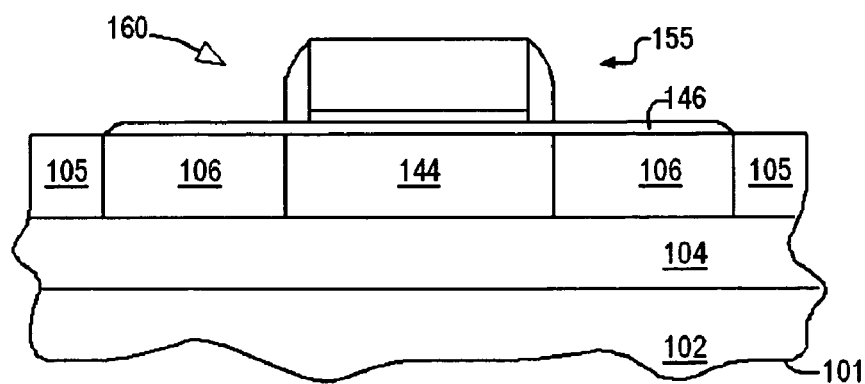
FIG. 13 depicts processing subsequent to FIG. 12 in which a gate module is formed.

In FIG. 12, a silicon germanium structure 144 is formed in the void 142 between semiconductor structures 106 and planarized. A capping layer 146, preferably of silicon, is then formed overlying structures 106 and 144. In FIG. 13, a gate module 155 is formed overlying silicon germanium structure 144 to form a high retention transistor 160 that is structurally equivalent to transistor 140 of FIG. 10.

Figure 14:
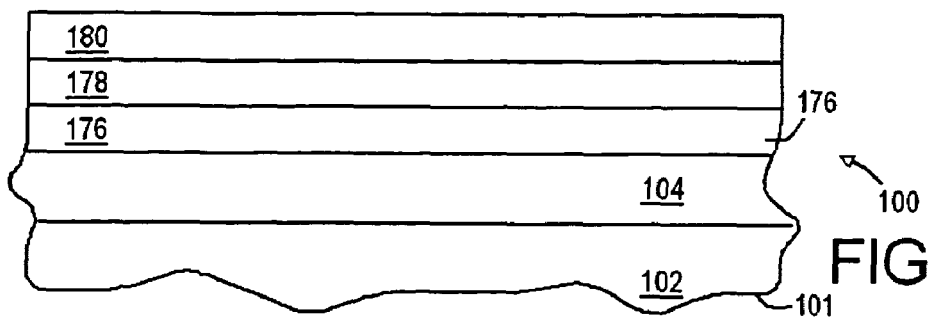
FIG. 14 depicts a wafer for use in a vertical, double gated transistor implementation of the reduced carrier recombination application in which a silicon germanium layer is formed between a pair of silicon layers over an insulating layer.
Figure 15:
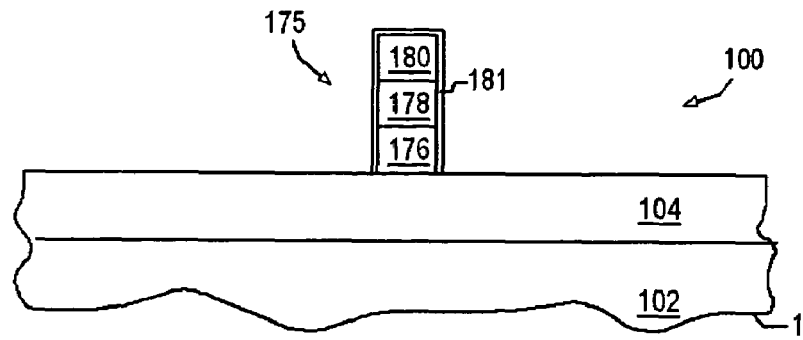
FIG. 15 depicts processing subsequent to FIG. 14 in which a fin is formed from the silicon-SiGe-silicon layers.
Figure 16:
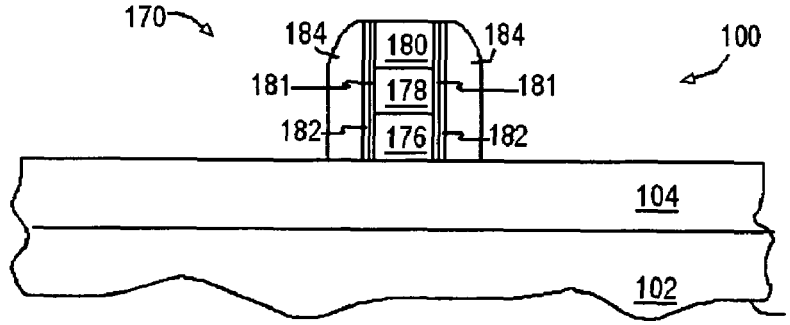
FIG. 16 depicts processing subsequent to FIG. 15 in which a gate dielectric is formed on the fin sidewalls and gate electrode spacers formed adjacent the gate dielectric.

Referring now to FIG. 14, another embodiment of the invention creates a potential well in the transistor channel of a vertical, double gated transistor. Vertical, double-gate transistors are known in the field of semiconductor fabrication. Vertical, double gated transistors may be used for 1T memory cells if the two gates are independent. See, e.g., C. Kuo, T. -J. King, and C. Hu, *A Capacitorless Double Gated DRAM Cell*, IEEE Electron Device Letters Vol. 23 No. 6 pp. 345-347 (June 2002). The processing depicted in FIG. 14 through FIG. 16 is suitable for fabricating a vertical, double gated, 1T memory cell exhibiting high retention characteristics. In FIG. 14, the wafer 101 includes a semiconductor layer 176 over a BOX layer 104. A migration barrier layer 178 is formed over semiconductor layer 176 and a second semiconductor layer 180 is formed over migration barrier layer 178. Layers 176 and 178 may be formed by CVD or epitaxial growth analogous to the formation of layers 110 and 112 shown in FIG. 1.

In FIG. 15, layers 176, 178, and 180 are patterned to form a fin 175 using conventional photolithography and etch processing. In addition, the depicted implementation shows an optional epitaxial layer 181 formed on exterior surfaces of fin 175. In this embodiment, the epitaxial layer 181 may be a silicon layer that functions in a manner analogous to the capping layer 110 depicted in FIGS. 1 through 6. In FIG. 16, gate dielectric layers 182 are then formed on sidewalls of fin 175 and conductive spacers 184 formed adjacent dielectric layer 182. The conductive spacers act as independent gate electrodes for the resulting transistor 170. In this transistor, layers 176 and 180 serve as the transistor's source and drain terminals. The presence of migration barrier layer 178 between layers 176 and 180 reduces the amount of migration and results in lower recombination and higher retention.

In addition to providing improved retention time, the relatively narrow bandgap of silicon germanium offers the potential to improve another characteristic of 1T memory cells. Two primary mechanisms are employed to program (write) a 1T memory cell, namely, impact ionization and band-to-band tunneling. Impact ionization is performed by biasing an NMOS transistor to an ON state (i.e., $V_{GS}>V_T$) and applying a sufficiently large positive drain voltage (e.g., $V_{DS}=1.8V$ or higher). Band-to-band tunneling is performed by biasing the gate electrode to a sufficiently negative voltage while simultaneously biasing the drain terminal to a sufficiently large positive voltage. The very high electric field in the vicinity where the gate electrode overlaps the source/drain structure produces a tunneling that creates electron-hole pairs.

Programming methods that employ tunneling consume less power than impact ionization methods because the transistor is biased to an off state during tunneling. However, the biasing conditions necessary to achieve tunneling are problematic because special circuits are required to generate the relatively high programming voltages. Lower programming voltages are always preferable to higher programming voltages in nonvolatile memory devices. The present invention makes use of the narrow bandgap of a material such as silicon germanium to achieve lower biasing voltages for band to band tunneling in a 1T memory cell. In one embodiment, the beneficial effect of low voltage programming is coupled with the improved charge retention described in the preceding paragraphs.

Figure 17:
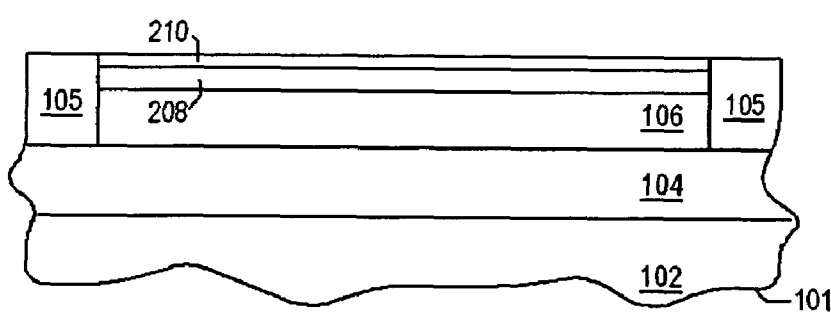
FIG. 17 depicts a wafer suitable for use in an embodiment emphasizing reduced biasing conditions required for programming by band-to-band tunneling according to an embodiment of the invention wherein a reduced bandgap material is formed over a semiconductor layer.

Referring to FIG. 17, the starting material (wafer) 101 for implementing one embodiment of a reduced bandgap tunneling technique is substantially the same as the wafer 101 depicted in FIG. 1 with a reduced bandgap layer 208 overlying a semiconductor layer 106 and a capping layer 210 overlying reduced bandgap layer 208. Reduced bandgap layer 208 is of a material (e.g., silicon germanium) having a bandgap that is less than the bandgap of the material (e.g., silicon) of semiconductor layer 106 and capping layer 210.

Figure 18:
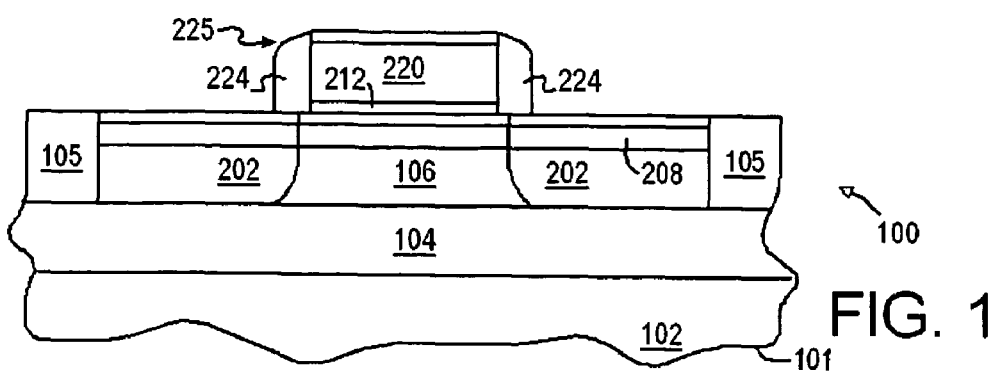
FIG. 18 depicts processing subsequent to FIG. 17 in which a gate module is formed over the wafer substrate and source/drain regions formed aligned to the gate module where the reduced bandgap layer extends through the source/drain regions.

In FIG. 18, a gate module 225 is formed overlying a gate dielectric 212. Gate module 225 includes a gate electrode 220 and sidewall spacers 224. After completion of gate module 225, source/drain regions 202 are formed in semiconductor layer 106 laterally disposed on either side (self aligned to) gate module 225. Source/drain regions 202 are preferably created by implanting an impurity species into the regions. In one embodiment, the source/drain regions 202 are heavily doped n-type regions suitable for use as NMOS transistors source/drain electrodes.

The presence of reduced bandgap layer 208 with source/drain regions 202 and in close proximity to the gate electrode 120 of gate module 225 facilitates tunneling at relatively low biasing conditions. In one embodiment, for example, adequate tunneling is achievable by biasing one of the source/drain regions to approximately 1.2 V, grounding the other source/drain region and biasing the gate electrode 120 to approximately -1.2V. This biasing represents a 30% improvement (reduction) in conventional biasing necessary to induce band to band tunneling.

Figure 19:
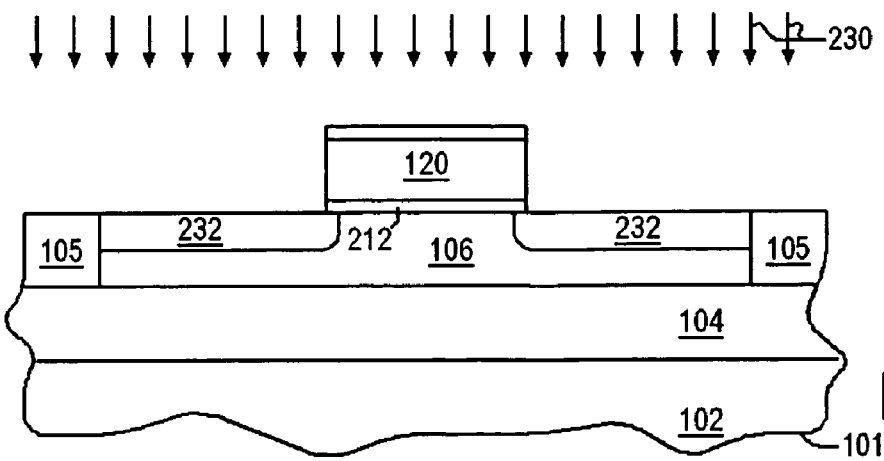
FIG. 19 depicts processing according to another embodiment of the reduced bandgap method of facilitating band to band tunneling where extension regions of a semiconductor layer are implanted with an impurity.

A second embodiment of the reduced bandgap tunneling technique is depicted with respect to FIG. 19 through FIG. 24. In this processing sequence, gate electrode 120 has been formed overlying a gate dielectric layer 212 overlying a semiconductor layer 106. Wafer 101 as depicted in FIG. 19 does not include additional layers over semiconductor layer 106.

Following formation of gate electrode 120, an extension ion implantation (represented by reference number 230) is performed to create sacrificial extension implant regions 232 in an upper portion of wafer 101 self-aligned to gate electrode 120. The extension implant 230 is used in this embodiment to create a region of semiconductor layer 106 that etches quickly with respect to the undoped portions of semiconductor layer 106. Suitable species for implant 230 include arsenic, phosphorous, and various other elements.

Figure 20:
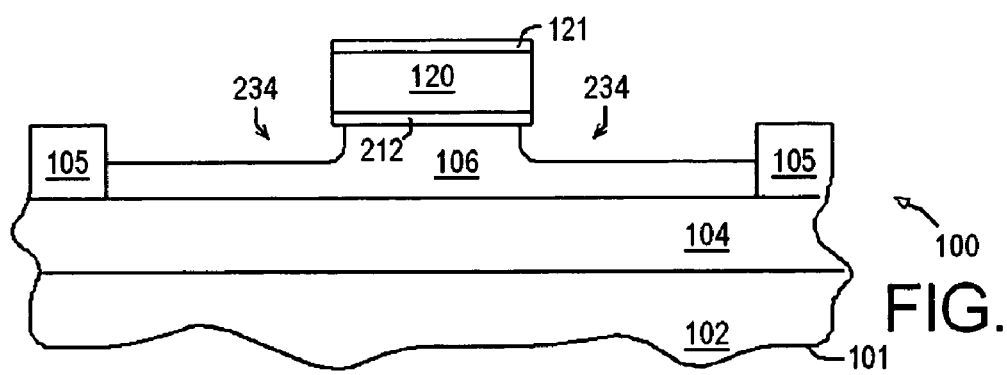
FIG. 20 depicts processing subsequent to FIG. 19 in which the implanted extension regions are etched away.

In FIG. 20, a silicon etch is performed to remove selectively the extension region portions of semiconductor layer 106. Selective removal of regions 232 results in the formation of voids 234 in wafer 101. The selective removal of regions 232 is facilitated by the different doping levels within semiconductor layer 106 with lightly doped or undoped region 106 etching substantially more slowly than extension regions 232.

Figure 21:
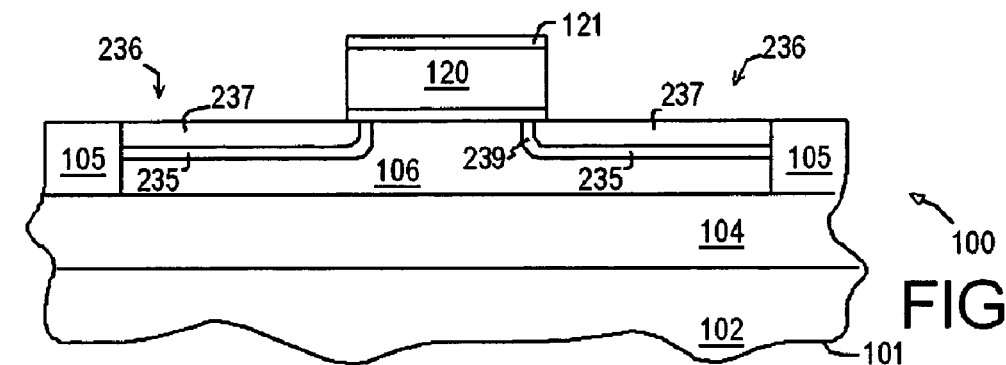
FIG. 21 depicts processing subsequent to FIG. 20 in which a portion of the extension region voids are filled with a narrow band gap semiconductor.

Referring to FIG. 21, source/drain structures 236 are formed in wafer 101 where the voids 234 were located in FIG. 20. Importantly, the source/drain structures 236 depicted in FIG. 21 include a first film 235 of a material having a first bandgap and a second film 237 of a material having a second bandgap that is less than the first bandgap. In one implementation, first film 235 is an n-type silicon region and second film 237 is an n+ silicon germanium region.

In this embodiment, the silicon first film 235 of source/drain structures 236 provides the extension region under normal bias (read conditions). During high field programming operations (with the drain voltage at a large positive voltage for NMOS), the depletion region will extend through a portion 239 of silicon first film 235 adjacent the transistor channel so that the low bandgap film 237 will be under bias such that it provides enhanced electron-hole generation. To facilitate this operation, silicon only film 235 is preferably thin and has an intermediate doping level (e.g., 5 nm thick and an impurity concentration of ~1e18 cm$^{-3}$).

Source/drain regions 236 may be formed by growing the first film 235 using a selective silicon epitaxy process and then growing second film 237 using selective n+ silicon germanium epitaxy. The advantage of this embodiment (having silicon material in layer 235 and silicon germanium in regions 237) is more efficient programming combined with a reduction of read disturb.

However, in another embodiment layer 235 may be silicon germanium material and regions 237 silicon material. The thickness of the SiGe 235 layer would be 20-60 A. The subsequent source drain definition may be performed such that the lateral p-n junction of the source drain extension comes fully to lie within the upper portion of the layer 235. The advantage of this embodiment is a more efficient programming by band-to-band tunneling mechanisms or by impact ionization mechanism. The programming by band-to-band mechanism is realized for the gate electrode bias below the threshold voltage and at high drain bias. The location of band-to-band generated electrons and holes is in the channel close to the channel-drain junction, within the SiGe layer 235. The programming by impact ionization is realized at gate electrode bias above the threshold voltage and drain bias larger than the gate electrode bias. The location of the elector-hole pairs generated by impact ionization is in the drain extension close to the channel-drain junction and within the upper portion of the SiGe layer 235.

Figure 22:
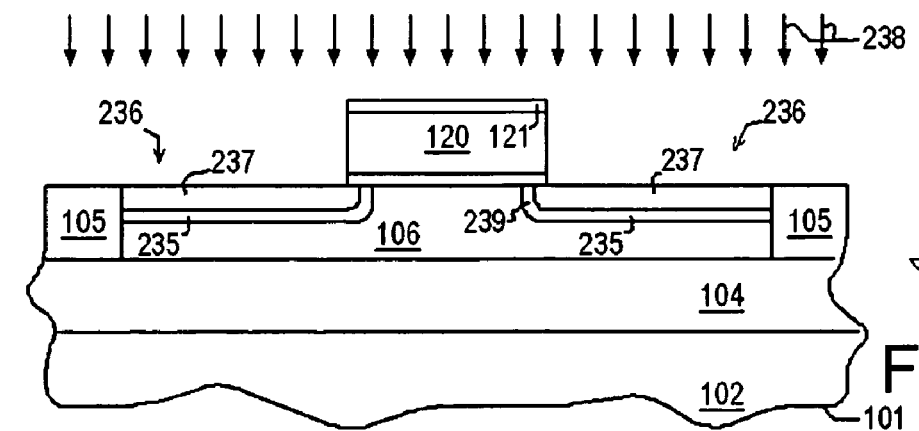
FIG. 22 depicts processing subsequent to FIG. 21 in which the narrow bandgap semiconductor extension regions are implanted with an extension impurity.

In FIG. 22, another extension implant (238) is performed to achieve the desired doping of second film 237 if additional doping is desired. It will be appreciated that there are many techniques that can be used to facilitate the forming of the offset between first and second regions 235 and 237, such as the use of multiple spacers together with selective epitaxial growth and implantation. The resulting doped source/drain structures are identified in FIG. 22 by reference numeral 236, which includes a silicon only region, 235, and a lower bandgap film 237. Regions 237 may be also grown higher than a primary surface of the device (the upper surface of semiconductor layer 106) to produce elevated source/drain structures analogous to source/drain structures 126 depicted in FIG. 6.

Figure 23:
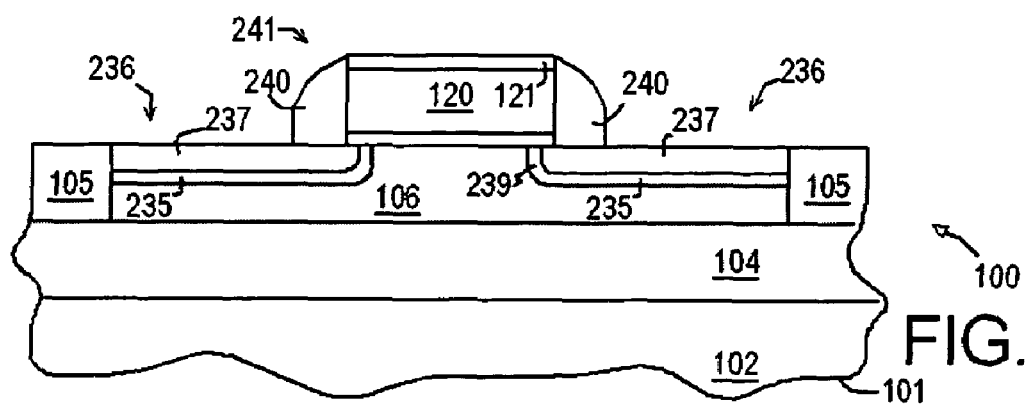
FIG. 23 depicts processing subsequent to FIG. 22 in which a gate module is completed by forming spacers on the gate electrode sidewalls.
Figure 24:
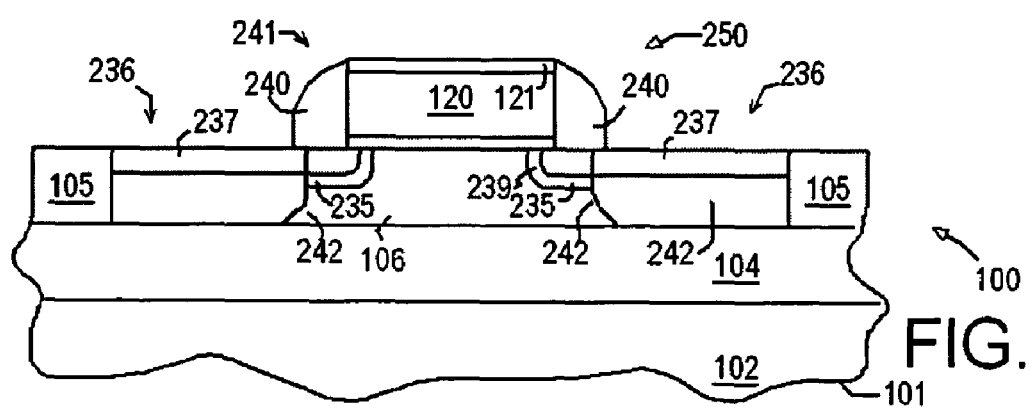
FIG. 24 depicts processing subsequent to FIG. 23 in which source/drain regions are formed aligned to the gate module.

Referring to FIG. 23, spacers 240 are formed on sidewalls of gate electrode 120 to form gate module 241. Thereafter, a source/drain implant (not shown) is performed to form source/drain regions 242 in semiconductor layer 106 of a transistor 250. The presence of a low bandgap source/drain 237 in such close proximity to gate electrode 120 facilitates band to band tunneling programming of transistor 250.

In the foregoing specification, the invention has been described with reference to specific embodiments. However, one of ordinary skill in the art appreciates that various modifications and changes can be made without departing from the scope of the present invention as set forth in the claims below. The specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process, comprising:
   forming a gate stack including a gate electrode overlying a gate dielectric overlying a channel body of a semiconductor substrate, the channel body overlying a buried dielectric layer;
   forming source/drain structures in source/drain regions of the substrate disposed on either side of the channel body, said forming of the source/drain structures including forming, in the source/drain regions, a layer of a second semiconductor material overlying a first semiconductor material, wherein a bandgap of the second material is different than a bandgap of the first material;
   forming a capping layer comprising the first semiconductor material overlying the layer of the second semiconductor material; and
   using the gate stack as a mask, patterning the capping layer and the layer of the second semiconductor material to form a two-dimensional migration barrier for liming vertical and lateral migration of majority carriers in the channel body.

2. The process of claim 1, wherein forming the source/drain regions includes:
   implanting the source/drain regions with an impurity species to form doped regions having an impurity concentration exceeding an impurity concentration of the channel body;
   etching the doped regions selectively to form voids;
   filling the voids with the second semiconductor material.

3. The method of claim 2, wherein filling the voids comprises lining the voids with a first film and forming a second film on the first film wherein the first film comprises the first semiconductor material and the second comprises the second semiconductor material.

4. The method of claim 3, wherein the channel body comprises silicon and the first film comprises silicon.

5. The method of claim 4, wherein the channel body is p-type silicon and the first film is n-type silicon.

6. The method of claim 5, wherein the second film heavily doped n-type silicon germanium.

7. The method of claim 3, wherein the first film comprises silicon germanium and the second film comprises silicon.

8. The method of claim 1, wherein the layer of the second semiconductor material comprises a continuous layer extending from a first source/drain region, through the channel body, to a second channel region.

9. The method of claim 8, wherein the first semiconductor material and the capping layer are silicon and further wherein the second semiconductor layer comprises silicon germanium.

10. A semiconductor fabrication method, comprising:
    forming a gate stack including a gate electrode overlying a gate dielectric overlying a channel body of a semiconductor layer overlying a buried oxide layer, wherein the semiconductor layer comprises a first semiconductor material;
    forming source/drain structures in source/drain regions of the semiconductor substrate laterally disposed on either side of the channel body, wherein the source/drain structures include a layer of a second semiconductor material overlying the first semiconductor material;
    wherein the layer of the second semiconductor material extends into the channel body underlying the gate electrode;

wherein the second semiconductor material has a narrower band gap than the first semiconductor material; and forming a capping layer comprising the first semiconductor material overlying the layer of the second semiconductor material such that the layer of the second semiconductor material creates a potential well for majority carriers in the channel body.

11. The method of claim 10, wherein the layer of the second semiconductor material is a continuous layer extending from a first source/drain region through the channel body to a second source/drain region.

12. The method of claim 10, wherein forming the source/drain structures comprises:

creating heavily doped areas in the source/drain regions;

etching the heavily doped areas to create voids, wherein the voids extend under a portion of the gate electrode;

growing a first film of the first semiconductor material to line the voids and growing a second film of the second semiconductor material on the first film.

\* \* \* \* \*

UNITED STATES PATENT AND TRADEMARK OFFICE
CERTIFICATE OF CORRECTION

PATENT NO. : 7,238,555 B2  Page 1 of 1
APPLICATION NO. : 11/172570
DATED : June 30, 2005
INVENTOR(S) : Marius K. Orlowski It is certified that error appears in the above-identified patent and that said Letters Patent is hereby corrected as shown below:

In Column 12, Line 42, Claim No. 6:
   Change "wherein the second film heavily" to --wherein the second film is heavily--

Signed and Sealed this

Fifth Day of August, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,238,555 B2 | Page 1 of 1 |
| APPLICATION NO. | : 11/172570 | |
| DATED | : July 3, 2007 | |
| INVENTOR(S) | : Marius K. Orlowski | |

It is certified that error appears in the above-identified patent and that said Letters Patent is hereby corrected as shown below:

In Column 12, Line 42, Claim No. 6:
    Change "wherein the second film heavily" to --wherein the second film is heavily--

This certificate supersedes the Certificate of Correction issued August 5, 2008.

Signed and Sealed this

Twenty-sixth Day of August, 2008

JON W. DUDAS
*Director of the United States Patent and Trademark Office*